United States Patent [19]

Bratt et al.

[11] Patent Number: 4,532,586

[45] Date of Patent: Jul. 30, 1985

[54] DIGITAL DATA PROCESSING SYSTEM WITH TRIPARTITE DESCRIPTION-BASED ADDRESSING MULTI-LEVEL MICROCODE CONTROL, AND MULTI-LEVEL STACKS

[75] Inventors: Richard G. Bratt, Wayland, Mass.; Stephen I. Schleimer, Chapel Hill, N.C.; Edward S. Gavrin, Lincoln, Mass.; John F. Pilat, Raleigh, N.C.; Steven J. Wallach, Saratoga, Calif.; Lawrence H. Katz, Oregon City, Oreg.; Douglas M. Wells, Chapel Hill, N.C.; Gerald F. Clancy, Saratoga, Calif.; Craig J. Mundie, Cary, N.C.; David H. Bernstein, Ashland, Mass.; Thomas M. Jones, Chapel Hill, N.C.; Brett L. Bachman, Boston, Mass.

[73] Assignee: Data General Corporation, Westboro, Mass.

[21] Appl. No.: 266,401

[22] Filed: May 22, 1981

[51] Int. Cl.³ .............................................. G06F 9/22
[52] U.S. Cl. ................................................... 364/200
[58] Field of Search ... 364/200 MS File, 900 MS File

[56] References Cited

U.S. PATENT DOCUMENTS

| 4,068,300 | 1/1978 | Bachman | 364/200 |
| 4,070,703 | 1/1978 | Negi | 364/200 |
| 4,109,310 | 8/1978 | England et al. | 364/200 |
| 4,156,278 | 5/1979 | Wilhite | 364/200 |
| 4,156,900 | 5/1979 | Gruno et al. | 364/200 |
| 4,156,910 | 5/1979 | Barton et al. | 364/200 |
| 4,197,578 | 4/1980 | Wada et al. | 364/200 |
| 4,200,927 | 4/1980 | Hughes et al. | 364/200 |
| 4,251,860 | 2/1981 | Mitchell et al. | 364/200 |
| 4,254,461 | 3/1981 | Chemla et al. | 364/200 |
| 4,254,463 | 3/1981 | Busby et al. | 364/200 |

Primary Examiner—Jerry Smith
Assistant Examiner—Gary V. Harkcom
Attorney, Agent, or Firm—Gerald Cechony; Joel Wall

[57] ABSTRACT

A digital computer system in which data storage is referred to by a descriptor comprising an object number denoting a variable-length block of storage, an offset indicating how far into that block a desired data item begins, and a length field denoting the length of the desired data item. Separate means exist for manipulating each of the three descriptor portions, thus facilitating repetitive operations on related or contiguous operands. Various levels of microcode control are included. Each level of microcode control has its own stack, facilitating interrupts between levels. Stacks are duplicated in "secure stacks" in memory to protect against loss of state data from the stacks.

18 Claims, 1 Drawing Figure

DIGITAL DATA PROCESSING SYSTEM WITH TRIPARTITE DESCRIPTION-BASED ADDRESSING MULTI-LEVEL MICROCODE CONTROL, AND MULTI-LEVEL STACKS

CROSS REFERENCE TO RELATED APPLICATIONS

The present patent application is related to the following patent applications, filed as filed as of even date:
Ser. No. 266,415
Ser. No. 266,425
Ser. No. 266,537

BACKGROUND OF THE INVENTION

1. Field of the Invention

The present invention relates to a digital data processing system and, more particularly, to a multiprocess digital data processing system suitable for use in a data processing network and having a simplified, flexible user interface and flexible, multileveled internal mechanisms.

2. Description of Prior Art

A general trend in the development of data processing systems has been towards systems suitable for use in interconnected data processing networks. Another trend has been towards data processing systems wherein the internal structure of the system is flexible, protected from users, and effectively invisible to the user and wherein the user is presented with a flexible and simplified interface to the system.

Certain problems and shortcomings affecting the realization of such a data processing system have appeared repeatedly in the prior art and must be overcome to create a data processing system having the above attributes. These prior art problems and limitations include the following topics.

First, the data processing systems of the prior art have not provided a system wide addressing system suitable for use in common by a large number of data processing systems interconnected into a network. Addressing systems of the prior art have not provided sufficiently large address spaces and have not allowed information to be permanently and uniquely identified. Prior addressing systems have not made provisions for information to be located and identified as to type or format, and have not provided sufficient granularity. In addition, prior addressing systems have reflected the physical structure of particular data processing systems. That is, the addressing systems have been dependent upon whether a particular computer was, for example, an 8, 16, 32, 64 or 128 bit machine. Since prior data processing systems have incorporated addressing mechanisms wherein the actual physical structure of the processing system is apparent to the user, the operations a user could perform have been limited by the addressing mechanisms. In addition, prior processor systems have operated as fixed word length machines, further limiting user operations.

Prior data processing systems have not provided effective protection mechanisms preventing one user from effecting another user's data and programs without permission. Such protection mechanisms have not allowed unique, positive identification of users requesting access to information, or of information, nor have such mechanisms been sufficiently flexible in operation. In addition, access rights have pertained to the users rather than to the information, so that control of access rights has been difficult. Finally, prior art protection mechanisms have allowed the use of "Trojan Horse arguments". That is, users not having access rights to certain information have been able to gain access to that information through another user or procedure having such access rights.

Yet another problem of the prior art is that of providing a simple and flexible interface user interface to a data processing system. The character of user's interface to a data processing system is determined, in part, by the means by which a user refers to and identifies operands and procedures of the user's programs and by the instruction structure of the system. Operands and procedures are customarily referred to and identified by some form of logical address having points of reference, and validity, only within a user's program. These addresses must be translated into logical and physical addresses within a data processing system each time a program is executed, and must then be frequently retranslated or generated during execution of a program. In addition, a user must provide specific instructions as to data format and handling. As such reference to operands or procedures typically comprise a major portion of the instruction stream of the user's program and requires numerous machine translations and operations to implement. A user's interface to a conventional system is thereby complicated, and the speed of execution of programs reduced, because of the complexity of the program references to operands and procedures.

A data processing system's instruction structure includes both the instructions for controlling system operations and the means by which these instructions are executed. Conventional data processing systems are designed to efficiently execute instructions in one or two user languages, for example, FORTRAN or COBOL. Programs written in any other language are not efficiently executable. In addition, a user is often faced with difficult programming problems when using any high level language other than the particular one or two languages that a particular conventional system is designed to utilize.

Yet another problem in conventional data processing systems is that of protecting the system's internal mechanisms, for example, stack mechanisms and internal control mechanisms, from accidental or malicious interference by a user.

Finally, the internal structure and operation of prior art data processing systems have not been flexible, or adaptive, in structure and operation. That is, the internal structure structure and operation of prior systems have not allowed and systems to be easily modified or adapted to meet particular data processing requirements. Such modifications may include changes in internal memory capacity, such as the addition or deletion of special purpose subsystems, for example, floating point or array processors. In addition, such modifications have significantly effected the users interface with the system. Ideally, the actual physical structure and operation of the data processing system should not be apparent at the user interface.

The present invention provides data processing system improvements and features which solve the above-described problems and limitations.

SUMMARY OF THE INVENTION

This invention relates to digital computer systems and particularly to digital computer systems suitable for use in large interconnected networks to which many memory devices and mass storage devices may be connected and on which large volumes of data may be available.

Instructions, stored in memory, contain operation codes specifying operations to be performed on data, and also contain names denoting certain data on which to perform those operations. The names are not merely unique on a per-processor basis, but are universally unique; that is, once data is stored under a particular name it may be accessed from any other processor with no possibility of ambiguity.

The processor of the present invention provides means for translating each name into a descriptor, which consists of three parts: an object field specifying an object, or variable-length block of data; an offset field, specifying the offset from the start of the object to the start of the desired datum; and a length field specifying the length of the desired datum.

The processor of the present invention includes means for separately manipulating each of the three parts of the descriptor; the offset field in particular may have extensive arithmetic and logical operations performed upon it, thus facilitating repetitive or recursive operations on successive or related operands.

Means are also provided for translating the descriptors to memory addresses, to which the memory means are responsive for storing and retrieving data.

The processor includes various levels of microcode control: one responsive to the instructions for controlling the processor in the execution of those instructions; one responsive to the monitor for controlling monitor functions; and one responsive to the arithmetic unit for controlling same. Each level of microcode control has its own stack, and the instruction level of the processor has its own stack as well, thus facilitating interrupting between various levels. Each stack is duplicated in a "secure stack" in memory, lessening the possibility of loss of control.

It is thus an object of the present invention to provide an improved data processing system.

It is another object of the present invention to provide a data processing system capable of use in large, interconnected data processing networks.

It is yet another object of the present invention to provide an improved addressing mechanism suitable for use in large, interconnected data processing networks.

It is still another object of the present invention to provide a simplified and flexible user interface to a data processing system.

It is yet a further object of the present invention to provide an improved mechanism for referring to operands.

It is yet another object of the present invention to provide a data processing system having a flexible internal structure capable of multiple, concurrent operations.

Other objects, advantages and features of the present invention will be understood by those of ordinary skill in the art, after referring to the following detailed description of the preferred embodiments and drawings wherein:

Figure 7:
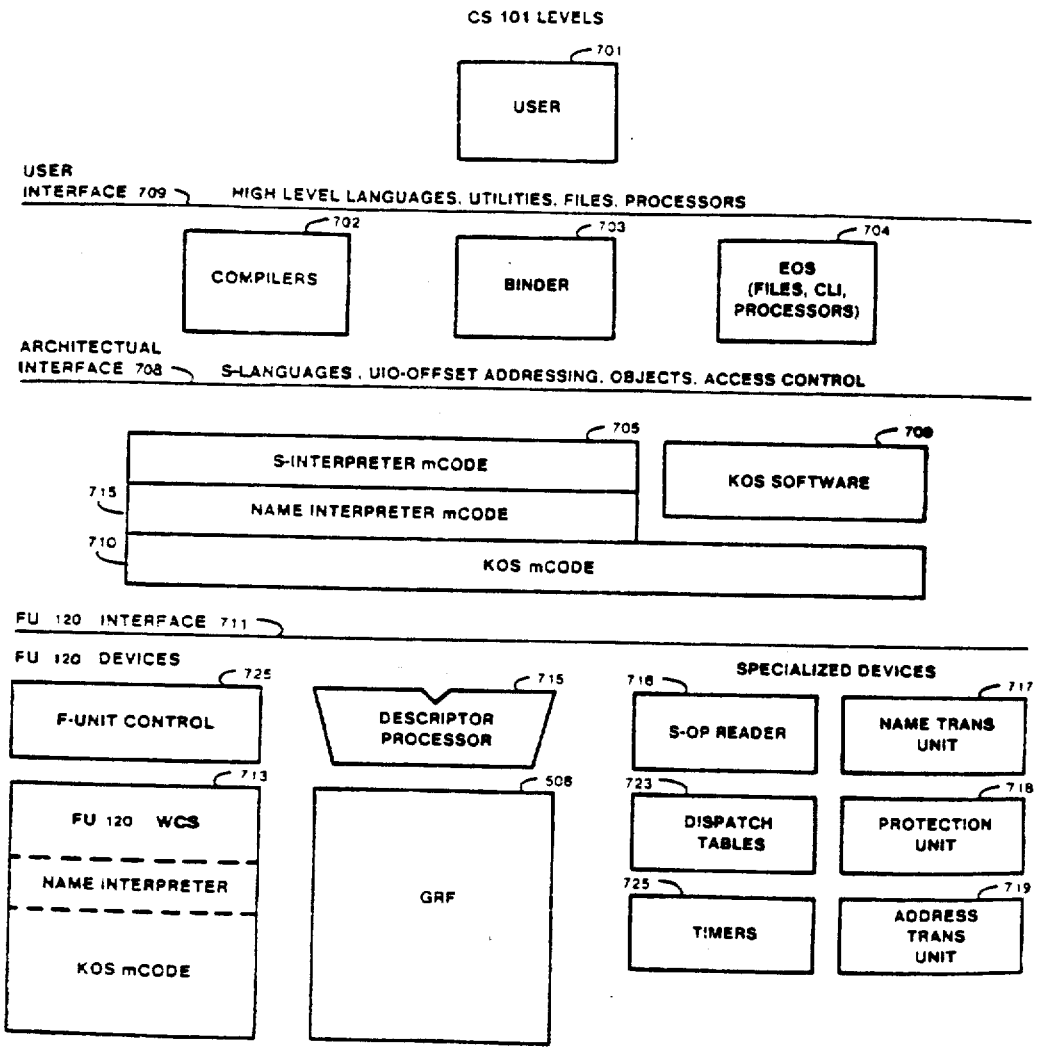
FIG. 7 is a diagram illustrating operating levels and mechanisms of the present computer.

This application incorporates by reference the entire application, Ser. No. 266,402, filed on May 22, 1981, of Ward Baxter II et al.

More particularly, attention is directed to FIGS. 7, 9, 103 through 105, 202, 270, and 271 of the drawings in application Ser. No. 266,402, and to that part of the specification, particularly at pages 124–131, 374–413, 450–461, and 618–661 thereof, which relate to subject matter of the claims herein.

We claim:

1. A digital computer system (CS 101) including memory means (MEM 112) for storing operands and instructions denoting certain operands, arithmetic and logic processor means (JP 114) executing said instructions for performing operations on said certain operands, bus means (MOD 140, JPD 142, PD 146) for conducting said certain operands and said instructions between said memory means and said arithmetic and logic processor means, said arithmetic and logic processor means comprising:

means (Name Translation Unit 27015) for deriving descriptors further denoting the certain operands from names contained in the instructions, each of said descriptors characterized by a first number specifying a block of data stored in said memory means, a second number specifying an offset from the beginning of said block of data to the start of one of said certain operands contained within said block of data, and a third number specifying the length of said one certain operand;

means (GRF 10354) for storing the descriptors;

descriptor processor means (DESP 20210, FIGS. 202 and 270) for facilitating repetitive operations on related ones of said certain operands by modifying at least portions of said descriptors;

means (ATU 10228, FIGS. 102 & 270) for translating the descriptors to memory addresses;

microcode control means for providing sequences of microinstructions controlling said arithmetic and logic processor means in executing said instructions; and microinstruction stack means comprising one or more stack frames, each capable of storing a state of execution of an interrupted microinstruction, thereby enabling interrupted microinstructions to be resumed without loss of data or processing.

2. The digital computer system of claim 1, wherein said memory means further comprises:

memory microinstruction stack means containing a plurality of further microinstruction stack frames being capable of storing the state of execution of an interrupted microinstruction of a sequence of microinstructions, and said microinstruction stack means further comprising microinstruction stack control means responsive to the operation of said arithmetic and logic processor means for providing stack control signals to said microinstruction stack means and to said memory microinstruction stack means for controlling the transfer of microinstruction stack frames between said microinstruction stack means and said memory microinstruction stack means.

3. The digital computer system of claim 1, wherein said microcode control means further comprises:

monitor microcode control means for storing sequences of monitor microinstructions for controlling monitor operation of arithmetic and logic processor means, said monitor microcode control means being responsive to operation of the arithmetic and logic processor means to provide said sequences of monitor microinstructions for controlling operation of the arithmetic and logic processor means, and said arithmetic and logic processor means further comprises:

monitor microinstruction stack means for containing at least one monitor stack frame for storing the state of execution of an interrupted monitor microinstruction of a sequence of monitor microinstructions.

4. The digital computer system of claims 1, 2, or 3, wherein said arithmetic and logic processor means further comprises:

arithmetic stack means connected from said bus means for performing arithmetic operations on said certain operands, arithmetic microcode control means for storing sequences of arithmetic microinstructions for controlling the operation of said arithmetic means, said arithmetic microcode control means being responsive to at least said operation of said arithmetic means to provide said sequences of said arithmetic microinstructions to said arithmetic means, and arithmetic stack means for containing at least one arithmetic stack frame for storing the state of execution of an interrupted arithmetic microinstruction.

5. The digital computer system of claim 4, wherein said memory means further comprises:

memory arithmetic stack means containing a plurality of further arithmetic stack frames, each of said plurality of further microinstruction stack frames being capable of storing the state of execution of an interrupted arithmetic microinstruction, and said arithmetic stack means further comprises arithmetic stack control means responsive to the operation of said arithmetic means for providing control signals to said arithmetic stack means and said memory arithmetic stack means for controlling the transfer of arithmetic stack frames between said arithmetic stack means and said memory arithmetic stack means.

6. The digital computer system of claims 1, 2, or 3 wherein said memory means further comprises:

instruction stack means responsive to the operation of said arithmetic and logic processor means and containing at least one instruction stack frame for storing the state of execution of an interrupted instruction.

7. The digital computer system of claim 4 wherein said memory means further comprises:

instruction stack means responsive to the operation of said arithmetic and logic processor means and containing at least one instruction stack frame for storing the state of execution of an interrupted instruction.

8. The digital computer system of claim 3, wherein:

said means for storing descriptors is horizontally divided into a first set of registers, a second set of registers, and a third set of registers, said first set of registers for storing said certain operands and certain of said descriptors, said second set of registers comprises said microinstruction stack means, and said third set of registers comprises said monitor stack means.

9. The digital computer system of claim 8 wherein said memory means further comprises:

instruction stack means responsive to the operation of said arithmetic and logic processor means and containing at least one instruction stack frame for storing the state of execution of an interrupted instruction.

10. A digital computer system (CS 101) including memory means (MEM 112) for storing operands and instructions denoting certain operands, arithmetic and logic processor means (JP 114) executing said instructions for performing operations on said certain operands, bus means (MOD 140, JPD 142, PD 146) for conducting said certain operands and said instructions between said memory means and said arithmetic and logic processor means, said arithmetic and logic processor means comprising:

means (Name Translation Unit 27015) for deriving descriptors further denoting the certain operands from names contained in the instructions, each of said descriptors characterized by a first number specifying a block of data stored in said memory means, a second number specifying an offset from the beginning of said block of data to the start of one of said certain operands contained within said block of data, and a third number specifying the length of said one certain operand;

means (GRF 10354) for storing the descriptors;

descriptor processor means (DESP 20210, FIGS. 202 and 270) for facilitating repetitive operations on related ones of said certain operands by modifying at least portions of said descriptors;

means (ATU 10228, FIGS. 102 & 270) for translating the descriptors to memory addresses;

string transfer means providing descriptors denoting successive certain operands for controlling transfer of successive of said certain operands between said memory means and said arithmetic and logic processor means;

microcode control means for providing sequences of microinstructions controlling said arithmetic and logic processor means in executing said instructions; and microinstruction stack means for storing a state of execution of an interrupted microinstruction, thereby enabling interrupted microinstructions to be resumed without loss of data or processing.

11. The digital computer system of claim 10, wherein said memory means further comprises:

memory microinstruction stack means containing a plurality of further microinstruction stack frames being capable of storing the state of execution of an interrupted microinstruction of a sequence of microinstructions, and said microinstruction stack means further comprising microinstruction stack control means responsive to the operation of said arithmetic and logic processor means for providing stack control signals to said microinstruction stack means and to said memory microinstruction stack means for controlling the transfer of microinstruction stack frames between said microinstruction stack means and said memory microinstruction stack means.

12. The digital computer system of claim 10, wherein said microcode control means further comprises:
   monitor microcode control means for storing sequences of monitor microinstructions for controlling monitor operation of arithmetic and logic processor means,
      said monitor microcode control means being responsive to operation of the arithmetic and logic processor means to provide said sequences of monitor microinstructions for controlling operation of the arithmetic and logic processor means, and
   said arithmetic and logic processor means further comprises:
      monitor microinstruction stack means for containing at least one monitor stack frame for storing the state of execution of an interrupted monitor microinstruction of a sequence of monitor microinstructions.

13. The digital computer system of claims 10, 11, or 12, wherein said arithmetic and logic processor means further comprises:
   arithmetic stack means connected from said bus means for performing arithmetic operations on said certain operands,
   arithmetic microcode control means for storing sequences of arithmetic microinstructions for controlling the operation of said arithmetic means,
      said arithmetic microcode control means being responsive to at least said operation of said arithmetic means to provide said sequences of said arithmetic microinstructions to said arithmetic means, and
   arithmetic stack means for containing at least one arithmetic stack frame for storing the state of execution of an interrupted arithmetic microinstruction.

14. The digital computer system of claim 13, wherein said memory means further comprises:
   memory arithmetic stack means containing a plurality of further arithmetic stack frames, each of said plurality of further microinstruction stack frames being capable of storing the state of execution of an interrupted arithmetic microinstruction, and
   said arithmetic stack means further comprises
      arithmetic stack control means responsive to the operation of said arithmetic means for providing control signals to said arithmetic stack means and said memory arithmetic stack means for controlling the transfer of arithmetic stack frames between said arithmetic stack means and said memory arithmetic stack means.

15. The digital computer system of claims 10, 11, or 12, wherein said memory means further comprises:
   instruction stack means responsive to the operation of said arithmetic and logic processor means and containing at least one instruction stack frame for storing the state of execution of an interrupted instruction.

16. The digital computer system of claim 12 wherein said memory means further comprises:
   instruction stack means responsive to the operation of said arithmetic and logic processor means and containing at least one instruction stack frame for storing the state of execution of an interrupted instruction.

17. The digital computer system of claim 12, wherein:
   said means for storing descriptors is horizontally divided into a first set of registers, a second set of registers, and a third set of registers,
      said first set of registers for storing said certain operands and certain of said descriptors,
      said second set of registers comprises said microinstruction stack means, and
      said third set of registers comprises said monitor stack means.

18. The digital computer system of claim 17 wherein said memory means further comprises:
   instruction stack means responsive to the operation of said arithmetic and logic processor means and containing at least one instruction stack frame for storing the state of execution of an interrupted instruction.

* * * * *